United States Patent
Inoshita et al.

(10) Patent No.: US 10,099,271 B2
(45) Date of Patent: Oct. 16, 2018

(54) PIN FIN FORMING METHOD

(71) Applicant: TOYOTA JIDOSHA KABUSHIKI KAISHA, Toyota-shi, Aichi-ken (JP)

(72) Inventors: Hirofumi Inoshita, Nagoya (JP); Akinori Tomioka, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 325 days.

(21) Appl. No.: 14/950,825

(22) Filed: Nov. 24, 2015

(65) Prior Publication Data

US 2016/0158825 A1   Jun. 9, 2016

(30) Foreign Application Priority Data

Dec. 5, 2014  (JP) .................................. 2014-246609

(51) Int. Cl.
*B21D 53/02*   (2006.01)
*B21H 7/00*   (2006.01)
(Continued)

(52) U.S. Cl.
CPC ............. *B21D 53/022* (2013.01); *B21H 7/00* (2013.01); *B21J 5/008* (2013.01); *B21K 23/00* (2013.01);
(Continued)

(58) Field of Classification Search
CPC .... F28F 3/022; F28F 2255/00; F28F 2255/16; H01L 23/3677; Y10T 29/4935; B23P 15/26; B23P 2700/10; B21C 23/00; B21C 25/02; B21D 53/02; B21D 53/022; B21D 53/04; B21H 7/00; B21H 8/00; B21H 8/005; B21J 5/008; B21J 5/02; B21K 23/00; B21B 1/38; B21B 2001/386;
(Continued)

(56) References Cited

U.S. PATENT DOCUMENTS 3,415,095 A    12/1968   Bringewald
5,354,581 A *  10/1994   Laube ................... B21H 8/005
                                                427/299
(Continued)

FOREIGN PATENT DOCUMENTS

EP       0633608 A1    1/1995
JP       H08-42985 A   2/1996
(Continued)

OTHER PUBLICATIONS

Translation of JPH10216882, generated Dec. 15, 2017.*
Translation of JP2010129774, generated Dec. 15, 2017.*

*Primary Examiner* — Matthew P Travers
(74) *Attorney, Agent, or Firm* — Oliff PLC

(57) ABSTRACT

A pin fin forming method is a method of forming a plurality of pin fins on a surface of a metal plate by subjecting the metal plate to extrusion using a die having a plurality of through-holes and a roll. The pin fin forming method includes placing the metal plate between the die and the roll, and pressing the metal plate from a first end of the metal plate to a second end of the metal plate, by moving the roll relative to the die. The metal plate is pressed from the first end of the metal plate to the second end of the metal plate, in a state where a side surface of the second end of the metal plate and an upper surface of the second end of the metal plate are fixed.

6 Claims, 8 Drawing Sheets

(51) Int. Cl.
    *H01L 21/48*       (2006.01)
    *H01L 23/367*    (2006.01)
    *B21J 5/00*        (2006.01)
    *B21K 23/00*     (2006.01)
    *F28F 3/02*       (2006.01)

(52) U.S. Cl.
    CPC ...... *H01L 21/4882* (2013.01); *H01L 23/3677* (2013.01); *F28F 3/022* (2013.01); *F28F 2255/00* (2013.01); *H01L 2924/0002* (2013.01)

(58) Field of Classification Search
    CPC ....... B21B 39/02; B21B 39/088; B21B 37/72; B23Q 1/25; B23Q 1/28; B23Q 1/64; B23Q 3/069
    USPC .......... 269/10, 303, 305, 315, 266, 289 MR; 72/192, 195, 196, 198, 207
    See application file for complete search history.

(56) References Cited

U.S. PATENT DOCUMENTS

| | | | |
|---|---|---|---|
| 6,189,363 B1* | 2/2001 | Lai | B21C 23/14 |
| | | | 29/890.03 |
| 6,367,152 B1* | 4/2002 | Kataoka | B23P 15/26 |
| | | | 165/185 |
| 9,555,505 B2* | 1/2017 | Kokubo | B21C 23/186 |
| 2004/0088860 A1* | 5/2004 | Liang | B21D 53/02 |
| | | | 29/890.03 |
| 2010/0024508 A1* | 2/2010 | Opferkuch | B21C 37/151 |
| | | | 72/252.5 |

FOREIGN PATENT DOCUMENTS

| | | |
|---|---|---|
| JP | H10-216882 A | 8/1998 |
| JP | 2010-129774 A | 6/2010 |
| JP | 2012-227365 A | 11/2012 |

\* cited by examiner

F I G . 8
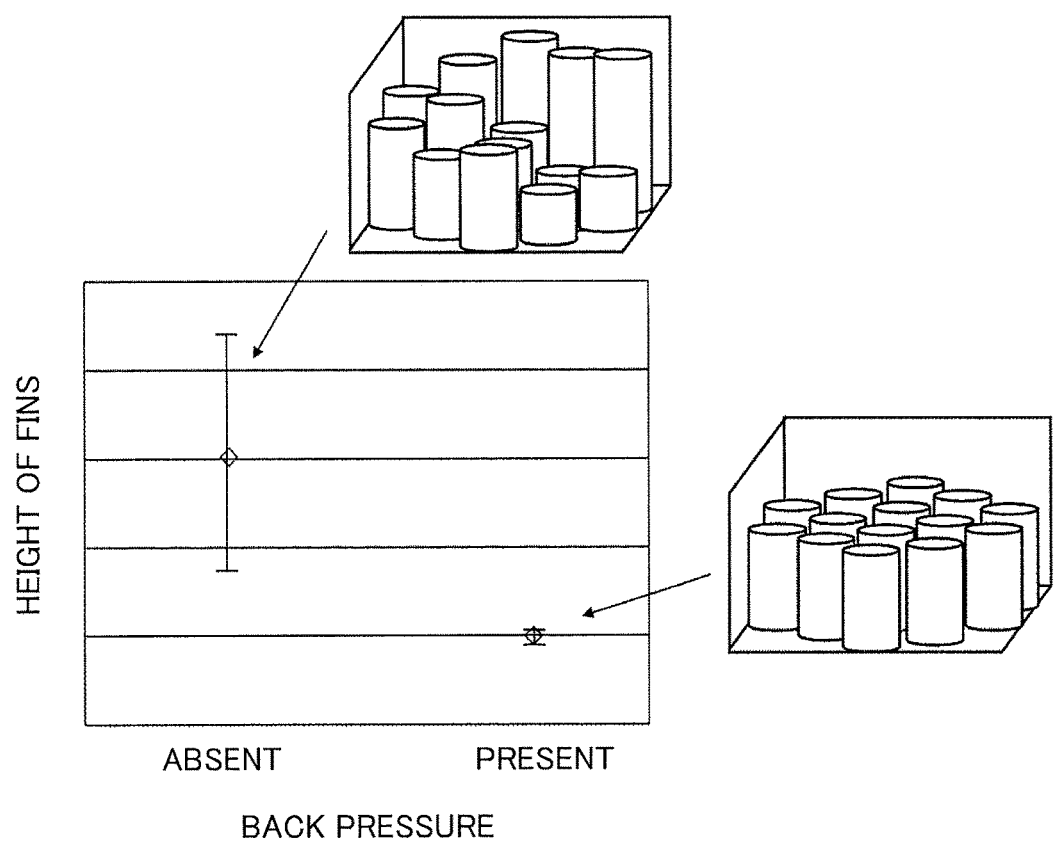

PIN FIN FORMING METHOD

INCORPORATION BY REFERENCE

The disclosure of Japanese Patent Application No. 2014-246609 filed on Dec. 5, 2014 including the specification, drawings and abstract is incorporated herein by reference in its entirety.

BACKGROUND OF THE INVENTION

1. Field of the Invention

The invention relates to pin fin forming methods, and more particularly, to pin fin forming methods suitable for improving pin fin forming performance.

2. Description of Related Art

Heat sinks typically have a plurality of pin fins for heat dissipation. There is a need for improvement in the pin fin forming performance for the purpose of enhancing heat dissipation performance of heat sinks.

Japanese Patent Application Publication No. 10-216882 (JP 10-216882 A) discloses related art. JP 10-216882 A discloses a method of forming unevenness on a material. In this method, the material is rolled between a die with a plurality of grooves and a roll, whereby unevenness is formed on the material by the grooves of the die.

However, in the method of JP 10-216882 A, for example, when pressing of a flat plate material is started from a first end of the material, a second end of the material may protrude out of the die or may be warped upward with respect to the die. As a result, parts of the material may inadequately extruded into the grooves, so that desired unevenness (i.e., pin fins) may fail to be formed on the material.

SUMMARY OF THE INVENTION

The invention provides a pin fin forming method that improves the pin fin forming performance.

A pin fin forming method according to an aspect of the invention is a method of forming a plurality of pin fins on a surface of a metal plate by subjecting the metal plate to extrusion using a die having a plurality of through-holes and a roll. The pin fin forming method includes placing the metal plate between the die and the roll, and pressing the metal plate from a first end of the metal plate to a second end of the metal plate, by moving the roll relative to the die. The metal plate is pressed from the first end of the metal plate to the second end of the metal plate, in a state where a side surface of the second end of the metal plate and an upper surface of the second end of the metal plate are fixed. Thus, the second end of the metal plate is prevented from protruding out of the die and prevented from being warped upward with respect to the die, so that the pin fin forming performance is improved.

In the pin fin forming method according to the above aspect, when the metal plate is pressed from the first end of the metal plate to the second end of the metal plate, back pressure may be applied to the pin fins in the through-holes from below the die. Thus, variations in the heights of the pin fins are reduced.

In the pin fin forming method according to the above aspect, pin portions of a back-pressure applying member may be inserted into the through-holes of the die from below the die, and the pin portions may apply back pressure to the pin fins.

In the pin fin forming method according to the above aspect, when a distance between the roll and the second end of metal plate is reduced to a predetermined value or lower while the metal plate is being pressed from the first end of the metal plate to the second end of the metal plate, a fixing member that fixes the upper surface of the second end of the metal plate may be removed. The removal of the fixing member prevents contact between the roll and the fixing member.

In the pin fin forming method, when the side surface and the upper surface of the second end of the metal plate are fixed, a first fixing member may be in contact with the side surface of the second end of the metal plate and the first fixing member may be fixed to the side surface of the second end of the metal plate, and a second fixing member may be in contact with the upper surface of the second end of the metal plate and the second fixing member may be fixed to the upper surface of the second end of the metal plate.

The metal plate may become a heat sink.

The invention provides a pin fin forming method that improves the pin fin forming performance.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 8 is a graph indicating the relationship between presence or absence of back pressure and variations in the height of the fins.

DETAILED DESCRIPTION OF EMBODIMENTS

Hereinafter, example embodiments of the invention will be described with reference to the accompanying drawings. It should be noted that the invention is not limited to the embodiments described below. In addition, the following description and the drawings are simplified as needed, for the sake of clarity.

Figure 1:
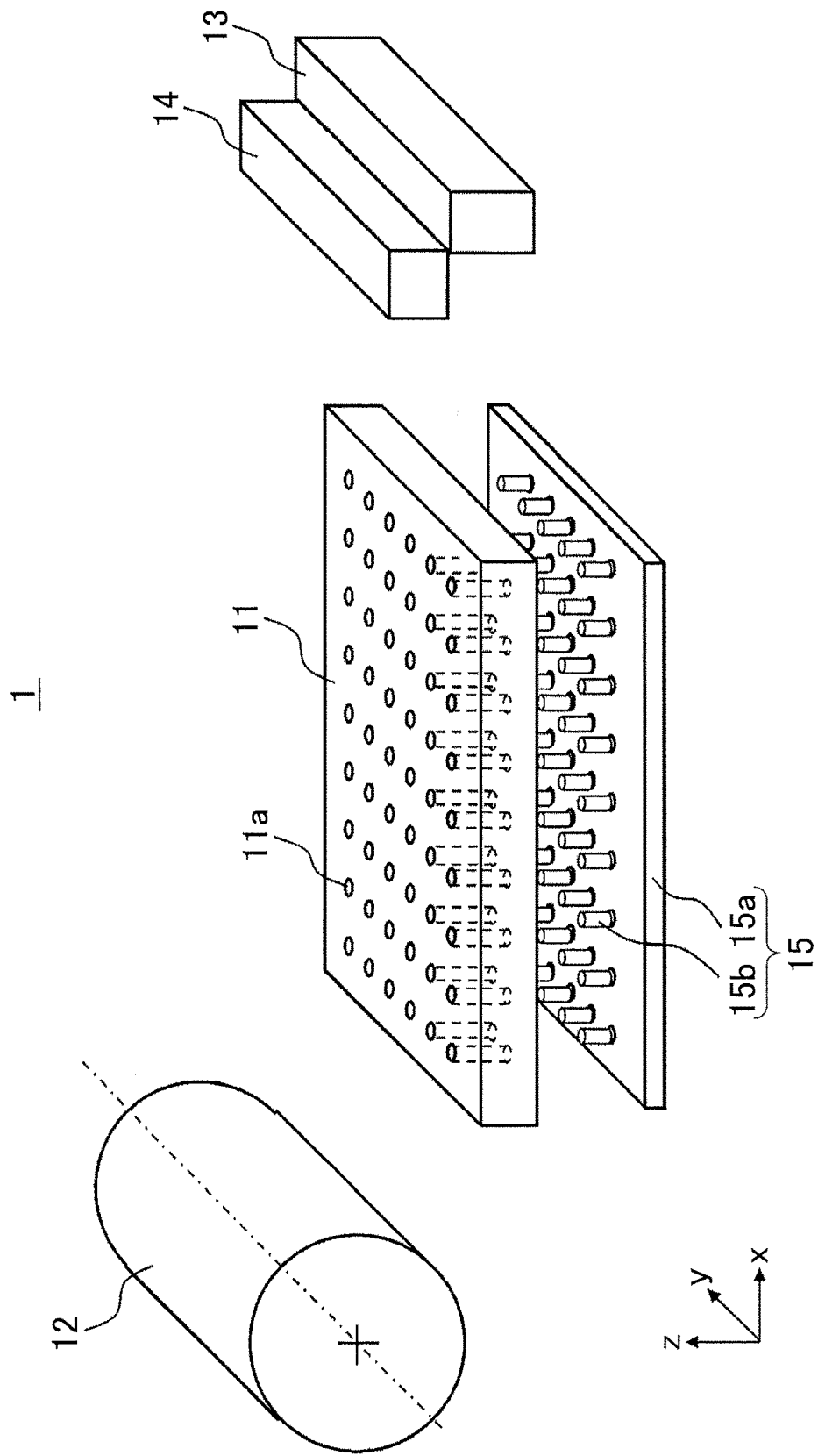
FIG. 1 is a perspective view of a part of a pin fin forming device used for implementing a pin fin forming method according to the invention.

FIG. 1 is a perspective view of a part of a device for implementing a pin fin forming method according to the invention. A pin fin forming device 1 includes a die 11, a roll 12, a fixing member 13, a fixing member 14, and a back-pressure applying member 15.

The die 11 is a die in the form of a flat plate. A plurality of through-holes 11a is formed in the die 11 so as to extend from an upper surface of the die 11 to an undersurface of the die 11.

The roll 12 has a cylindrical column shape, and is rotatable about the direction of axis (the direction of the y-axis). A metal plate 2 is placed on the die 11, and the roll 12 rotates and moves along an upper surface of the metal plate 2, so that the metal plate 2 is pressed from a first end 2a of the metal plate 2 to a second end 2b of the metal plate 2. Thus, parts of the metal plate 2 are extruded into the through-holes 11a. In the pin fin forming device 1, the roll 12 may move along the upper surface of the metal plate 2, or the die 11 and the metal plate 2 may move together. In short, the roll 12 moves relative to the die 11, so that the metal plate 2 is pressed from the first end 2a of the metal plate 2 to the second end 2b of the metal plate 2.

The back-pressure applying member 15 includes a mount portion 15a in the form of a flat plate, and a plurality of pin portions 15b standing on an upper surface of the mount portion 15a. The pin portions 15b can be inserted into the through-holes 11a of the die 11. The mount portion 15a and pin portions 15b that constitute the back-pressure applying member 15 may be formed so as to be integral with each other. Alternatively, the mount portion 15a and pin portions 15b may be formed separately from each other and the mount portion 15a may support the pin portions 15b. When the mount portion 15a and pin portions 15b are formed separately from each other, the mount portion 15a and pin portions 15b are not necessarily bonded to each other.

The fixing member 13 has, for example, a prism shape. When the metal plate 2 is placed on the die 11, the fixing member 13 is brought into contact with a side surface of the second end 2b of the metal plate 2 and is fixed to the side surface of the second end 2b of the metal plate 2. More preferably, the fixing member 13 is brought into contact with the entirety of the side surface of the second end 2b of the metal plate 2 and is fixed to the entirety of the side surface of the second end 2b of the metal plate 2. Thus, the side surface of the second end 2b of the metal plate 2 is fixed by the fixing member 13, so that the fixing member 13 prevents the second end 2b of the metal plate 2 from protruding out of the die 11 during extrusion. The fixing member 13 may have any shape as long as the fixing member 13 is able to prevent the metal plate 2 from being displaced in the rolled direction of the metal plate 2 (the direction toward the plus side in the x-direction), and fixing member 13 does not necessarily have a prism shape.

The fixing member 14 has, for example, a prism shape. When the metal plate 2 is placed on the die 11, the fixing member 14 is brought into contact with an upper surface of the second end 2b of the metal plate 2, and is fixed to the upper surface of the second end 2b of the metal plate 2. Thus, the upper surface of the second end 2b of the metal plate 2 is fixed to the fixing member 14, so that the fixing member 14 prevents the second end 2b of the metal plate 2 from being warped upward during extrusion. The fixing member 14 may have any shape as long as the fixing member 14 can be brought into contact with the upper surface of the second end 2b of the metal plate 2 and fixed to the upper surface of the second end 2b of the metal plate 2, and the fixing member 14 does not necessarily have a prism shape.

Pin Fin Forming Method

Figure 2:
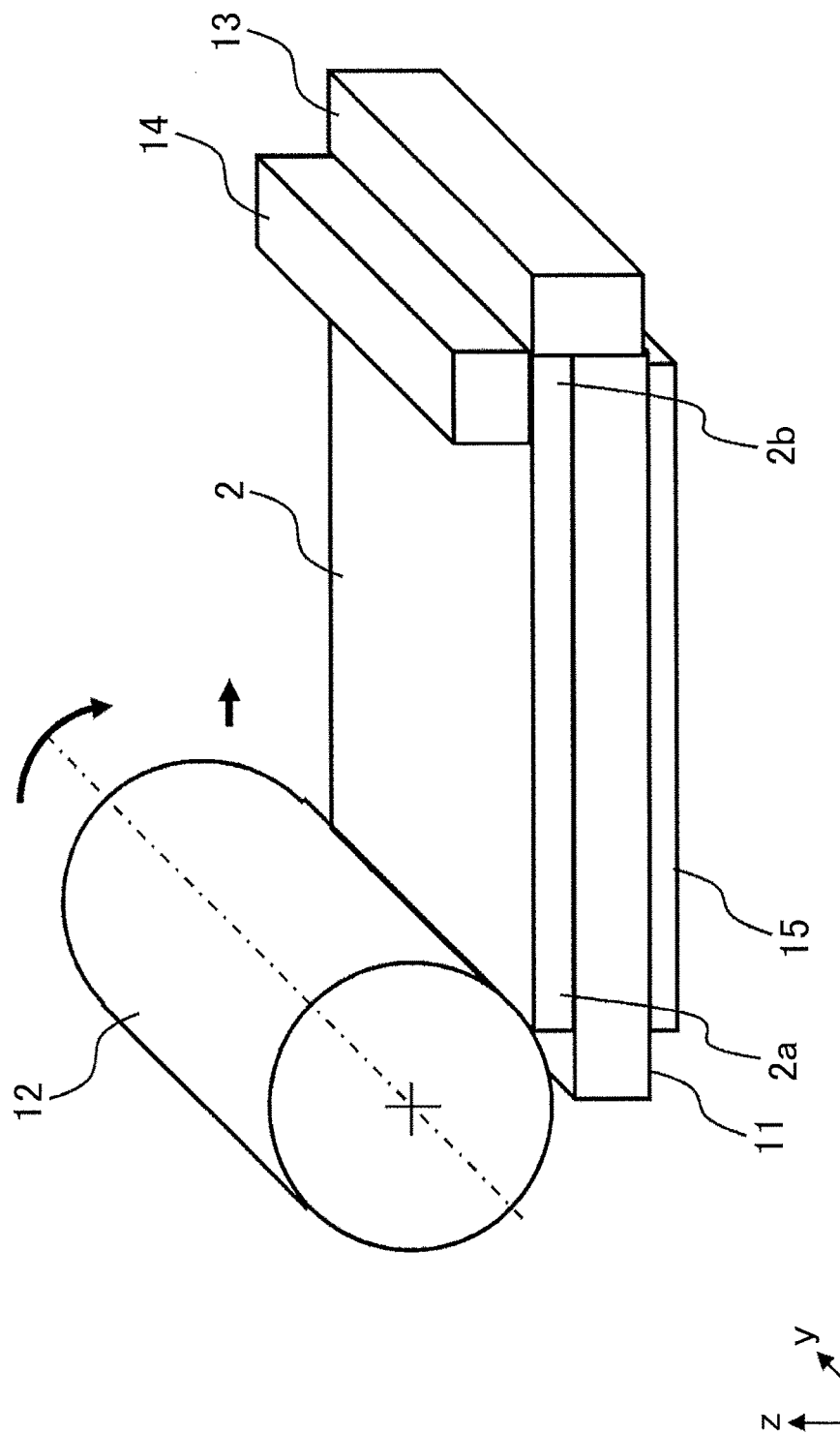
FIG. 2 is a perspective view of a state in which a metal plate is disposed in the pin fin forming device in FIG. 1.

Next, the pin fin forming method will be described. Initially, the metal plate 2 is placed on the die 11, as shown in FIG. 2. In other words, the metal plate 2 is placed between the die 11 and the roll 12. The metal plate 2 is made of metal, such as aluminum, copper, or an alloy of aluminum and copper.

The roll 12 is placed at the first end 2a of the metal plate 2. The fixing member 13 and the fixing member 14 are placed at the second end 2b of the metal plate 2. The fixing member 13 is brought into contact with the side surface of the second end 2b of the metal plate 2 and is fixed to the side surface of the second end 2b of the metal plate 2. The fixing member 14 is brought into contact with the upper surface of the second end 2b of the metal plate 2 and is fixed to the upper surface of the second end 2b of the metal plate 2.

In addition, the pin portions 15b of the back-pressure applying member 15 are inserted into the through-holes 11a from below the die 11.

Figure 3:
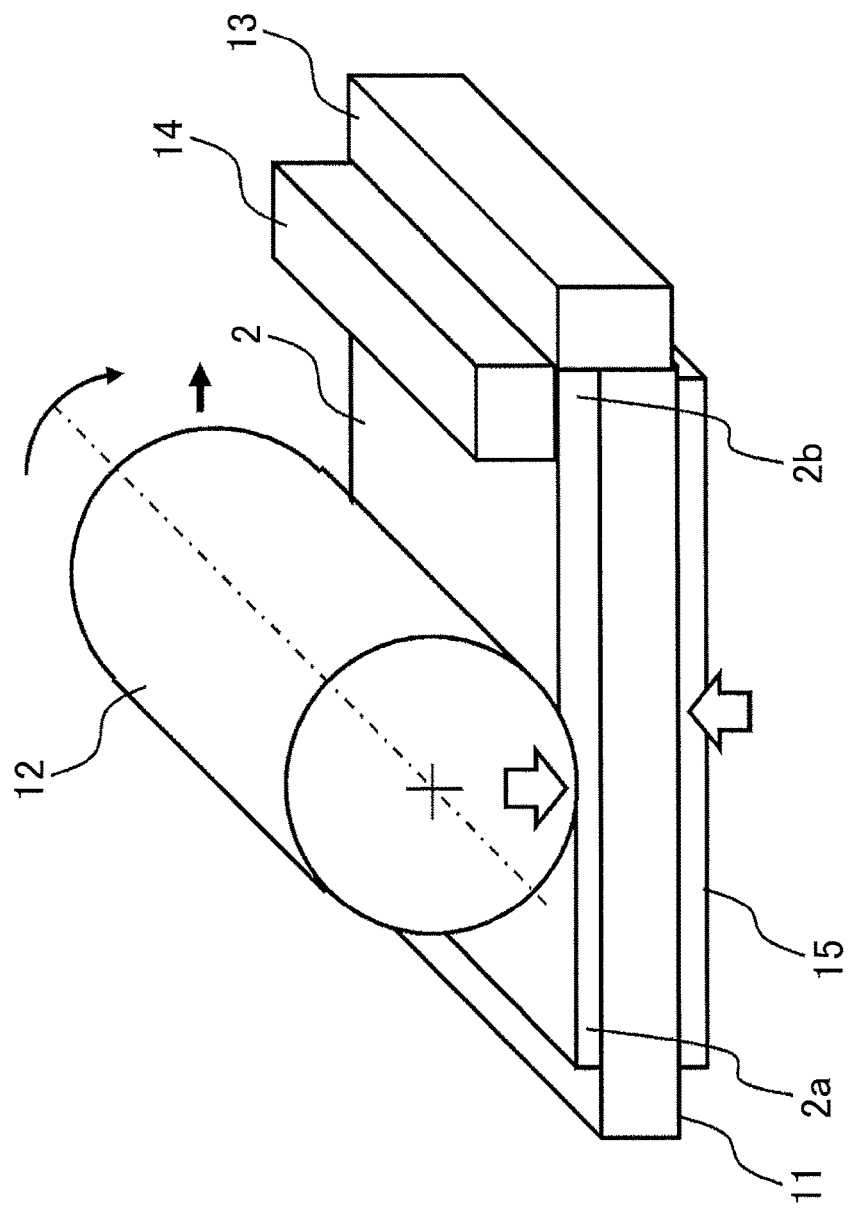
FIG. 3 is a perspective view of a state in which the metal plate is being pressed from a first end of the metal plate to a second end of the metal plate, in the pin fin forming device in FIG. 1.
Figure 4:
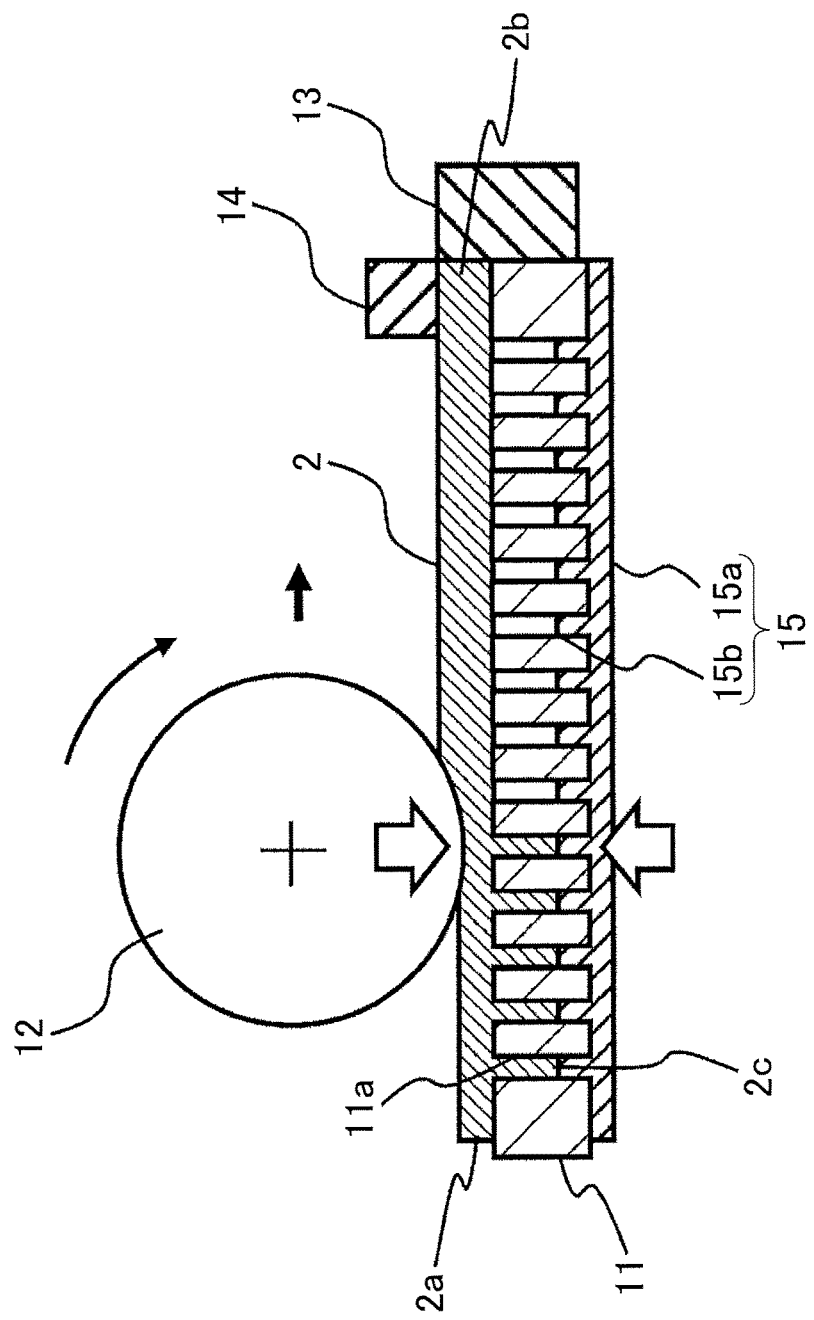
FIG. 4 is a sectional view of the state in which the metal plate is being pressed from the first end to the second end, in the pin fin forming device in FIG. 1.

Next, as shown in FIG. 3 and FIG. 4, the roll 12 rotates and moves from the first end 2a of the metal plate 2 to the second end 2b of the metal plate 2, so that the metal plate 2 is pressed from the first end 2a of the metal plate 2 to the second end 2b of the metal plate 2. Thus, parts of the metal plate 2 are extruded into the through-holes 11a. The parts of the metal plate 2 extruded into the through-holes 11a become pin fins 2c formed on the surface of the metal plate 2.

The side surface of second end 2b of the metal plate 2 is fixed by the fixing member 13, and the upper surface of second end 2b of the metal plate 2 is fixed by the fixing member 14. Thus, when pressing of the metal plate 2 is started from the first end 2a, the fixing member 13 and fixing member 14 prevent the second end 2b of the metal plate 2 from protruding out of the die 11 and from being warped upward. As a result, parts of the metal plate 2 are adequately extruded into the through-holes 11a, so that desired pin fins 2c are formed on the surface of the metal plate 2.

In addition, the pin portions 15b of the back-pressure applying member 15 are inserted into the through-holes 11a from below the die 11 and the pin portions 15b apply back pressure to the pin fins 2c, so that variations in the heights of the pin fins 2c formed through extrusion are reduced. For example, the magnitude of the back pressure is approximately five percent of the yield stress due to the roll 12. Note that the structure of the back-pressure applying member 15 is not limited to the above-described structure. The structure of the back-pressure applying member 15 may be any structure that allows application of back pressure to the pin fins 2c in the through-holes 11a.

Figure 5:
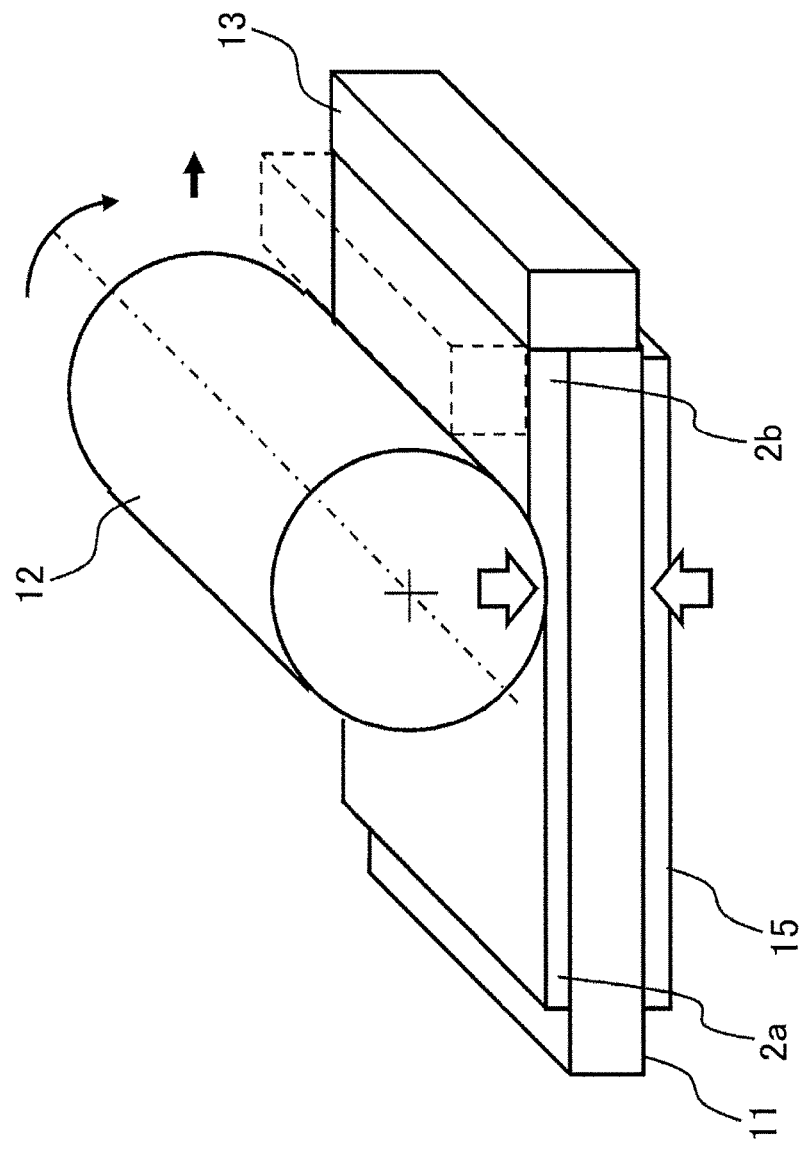
FIG. 5 is a perspective view of a state in which a fixing member of the pin fin forming device is removed.

Next, as shown in FIG. 5, when the distance between the roll 12 and the second end 2b of metal plate 2 is reduced to a predetermined value or lower, the fixing member 14 is removed. The removal of the fixing member 14 prevents contact between the roll 12 and the fixing member 14. In addition, the fixing member 13 is moved, for example, downward so as to prevent contact with the roll 12.

Figure 6A:
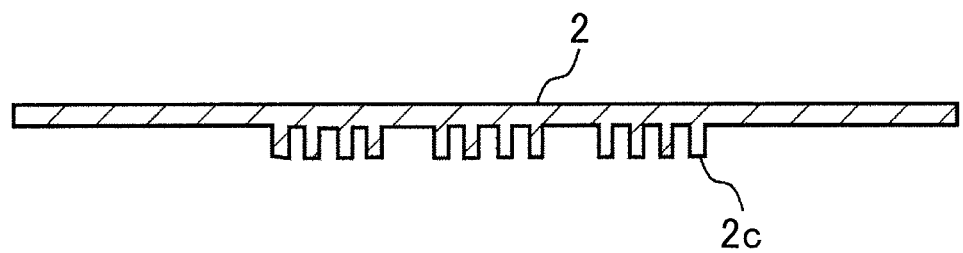
FIG. 6A is a sectional view of pin fins formed on a surface of the metal plate by the pin fin forming method according to the invention.
Figure 6B:
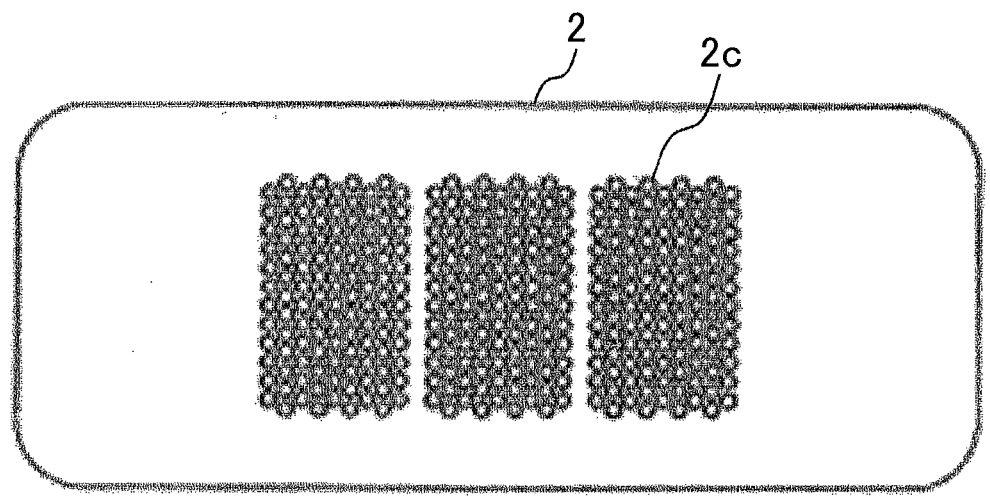
FIG. 6B is a plan view of the pin fins formed on the surface of the metal plate by the pin fin forming method according to the invention.

By the method described above, for example, the pin fins 2c, as shown in FIG. 6A and FIG. 6B, are formed on the surface of the metal plate 2. The metal plate 2 with the pin fins 2c is used as, for example, a heat sink.

Figure 7:
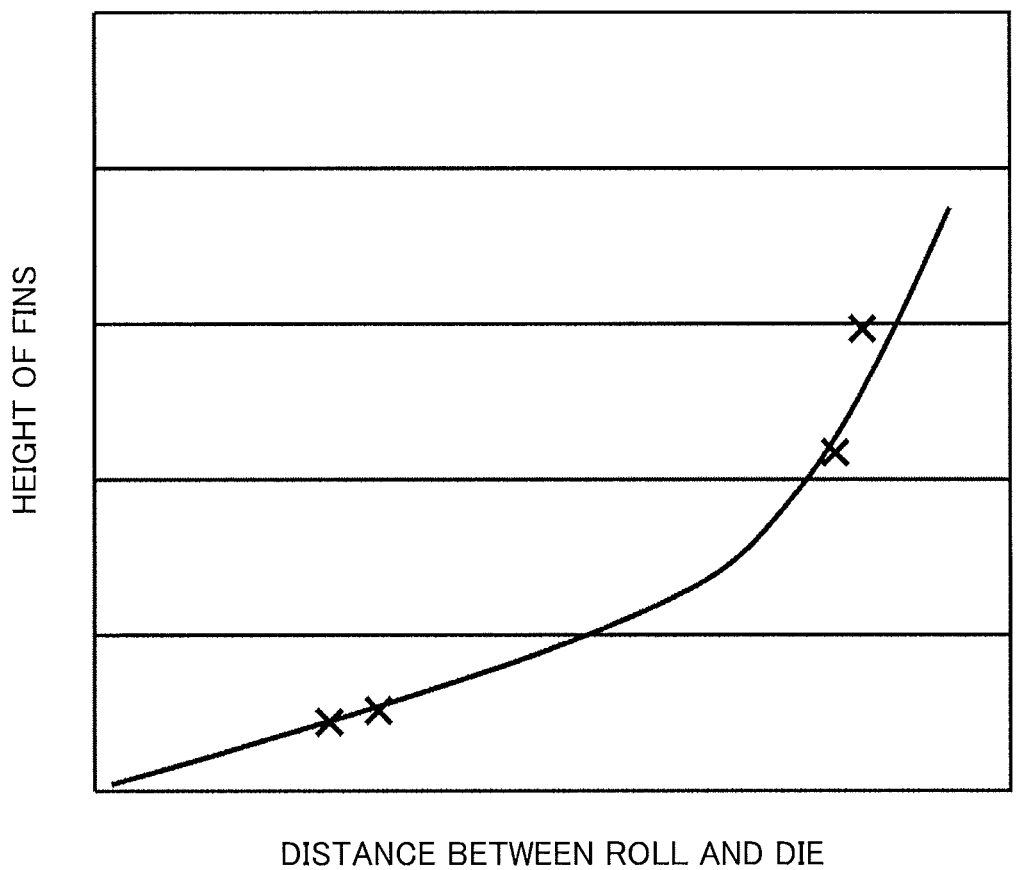
FIG. 7 is a graph indicating the relationship between the distance between the roll and the die, and the height of the fins.

FIG. 7 is a graph indicating the relationship between the distance between the roll 12 and the die 11 in the vertical direction and the height of the fins. As shown in FIG. 7, the height of the pin fins 2c can be controlled by adjusting the distance between the die 11 and the roll 12.

FIG. 8 is a graph indicating the relationship between presence or absence of back pressure and variations in the height of the fins. As shown in the FIG. 8, when back pressure is applied to the pin fins 2c in the through-holes 11a, variations in the heights of the pin fins 2c are smaller than those when back pressure is not applied to the pin fins 2c in the through-holes 11a.

As described above, in the pin fin forming method according to the invention, the metal plate 2 is pressed from the first end 2a of the metal plate 2 to the second end 2b of the metal plate 2, in a state where the side surface and upper surface of the second end 2b of the metal plate 2 are fixed by the fixing members 13, 14. Thus, when pressing of the metal plate 2 is started from the first end 2a of the metal plate 2, the fixing member 13 prevents the second end 2b of the metal plate 2 from protruding out of the die 11 and the fixing member 14 prevents the second end 2b of the metal plate 2 from being warped upward. As a result, parts of the metal plate 2 are adequately extruded into the through-holes 11a, so that desirable pin fins 2c are formed on the surface of the metal plate 2.

In the pin fin forming method according to the invention, the metal plate 2 is pressed by the roll 12 successively from the first end 2a of the metal plate 2 to the second end 2b of the metal plate 2, so that extrusion can be performed under low load. Even when the metal plate 2 is thin, extrusion can be performed under low load. Thus, the pin fin forming method reduces the cost of forming pin fins.

A product obtained through forming has a trace extending in the rolled direction, which is made by the roll 12. Therefore, it is easily determined whether or not the product is made by the pin fin forming method according to the invention.

The invention is not limited to the above-described embodiments, and various changes and modifications may be made to the above-described embodiments within the scope of the invention.

What is claimed is:

1. A pin fin forming method of forming a plurality of pin fins on a surface of a metal plate by subjecting the metal plate to extrusion using a die having a plurality of through-holes and a roll, the pin fin forming method comprising:

placing the metal plate between the die and the roll; and pressing the metal plate from a first end of the metal plate to a second end of the metal plate, by moving the roll relative to the die, wherein the metal plate is pressed from the first end of the metal plate to the second end of the metal plate, in a state where a side surface of the second end of the metal plate and an upper surface of the second end of the metal plate are fixed with at least one fixing member, and a side surface of the first end of the metal plate and an upper surface of the first end of the metal plate are not fixed.

2. The pin fin forming method according to claim 1, wherein, when the metal plate is pressed from the first end of the metal plate to the second end of the metal plate, back pressure is applied from below the die to the pin fins in the through-holes.

3. The pin fin forming method according to claim 1, wherein pin portions of a back-pressure applying member are inserted into the through-holes of the die from below the die, and the pin portions apply back pressure to the pin fins.

4. The pin fin forming method according to claim 1, wherein, when a distance between the roll and the second end of the metal plate is reduced to a predetermined value or lower while the metal plate is being pressed from the first end of the metal plate to the second end of the metal plate, the fixing member that fixes the upper surface of the second end of the metal plate is removed.

5. The pin fin forming method according to claim 1, wherein, when the side surface and the upper surface of the second end of the metal plate are fixed, a first fixing member is in contact with the side surface of the second end of the metal plate and the first fixing member is fixed to the side surface of the second end of the metal plate, and a second fixing member is in contact with the upper surface of the second end of the metal plate and the second fixing member is fixed to the upper surface of the second end of the metal plate.

6. The pin fin forming method according to claim 1, wherein the metal plate becomes a heat sink.

* * * * *